United States Patent
Chien

(10) Patent No.: US 10,935,195 B1
(45) Date of Patent: Mar. 2, 2021

(54) COB LIGHT HAS EVEN BRIGHTNESS ILLUMINATION

(71) Applicant: Tseng-Lu Chien, Walnut, CA (US)

(72) Inventor: Tseng-Lu Chien, Walnut, CA (US)

( * ) Notice: Subject to any disclaimer, the term of this patent is extended or adjusted under 35 U.S.C. 154(b) by 0 days.

(21) Appl. No.: 16/683,779

(22) Filed: Nov. 14, 2019

(51) Int. Cl.
F21K 9/69 (2016.01)
F21V 33/00 (2006.01)
H01L 27/15 (2006.01)
F21V 19/00 (2006.01)

(52) U.S. Cl.
CPC .............. *F21K 9/69* (2016.08); *F21V 19/003* (2013.01); *F21V 33/0004* (2013.01); *H01L 27/153* (2013.01)

(58) Field of Classification Search
CPC ..... F21K 9/69; F21K 9/62; F21K 9/68; F21V 33/00004; F21V 23/04; H01L 27/153; H01L 2224/48091; H01L 2924/01322; F21Y 2115/10; Y10S 362/30; H05B 45/00
USPC .............................................. 362/249.05, 95
See application file for complete search history.

(56) References Cited

U.S. PATENT DOCUMENTS

| | | | | |
|---|---|---|---|---|
| 5,446,441 A * | 8/1995 | Su | ............ | B62J 6/00 340/321 |
| 5,473,517 A * | 12/1995 | Blackman | ............ | F21S 9/022 362/95 |
| 7,390,104 B2 * | 6/2008 | Coushaine | ............ | F21S 9/02 362/184 |
| 8,003,886 B1 * | 8/2011 | Rintz | ............ | H05B 45/10 174/66 |
| 2011/0209368 A1 * | 9/2011 | Quaal | ............ | F21V 23/005 40/550 |

* cited by examiner

*Primary Examiner* — Andrew J Coughlin
*Assistant Examiner* — Jessica M Apenteng
(74) *Attorney, Agent, or Firm* — Bacon&Thomas, PLLC

(57) ABSTRACT

COB (Chip On Board) cover-plate light has surface similar with house switch cover-plate with at least one of toggle switch, dimmer switch, round switch, rocket switch, twist switch, and switch cover-plate has built-in number of the COB light source(s) install on side of inner wall of COB light to emit the light inward through multiple reflection and refraction of light-beam to get even brightness emit out from front surface where has at least one of (1) at least one of optic treatments, opaque, whiten, and (2) at least one of heat-transfer, sticker, printing, painting the preferred design, art, cartoon, character, sport-team, clubs, school-team logo or arts of front surface.

19 Claims, 1 Drawing Sheet

COB LIGHT HAS EVEN BRIGHTNESS ILLUMINATION

BACKGROUND

Chips on Board light source (hereafter as COB) switch cover-plate light has built-in toggle switch has at least one of elongate COB light-strip emit light-beam to inner wall of COB cover-plate light, the light emit out is very strong because COB has desire numbers of dip or chip or dice LED(s) inside and each LED(s) has pre-determined brightness, wattage to offer preferred brightness, color(s).

The current invention to apply the COB light-source to emit to inner-housing of the COB cover light is different with market other COB switch-cover light because the current invention COB light beam is not direct to emit out to viewer which harm people eyes. The current invention the COB light beam is emit to inner housing, walls and light beam hit the directly and be reflected by inner wall or housing for multiple times reflection and refraction to emit out from front or top surface.

Where the front or top surface had where has at least one of (1) at least one of optic treatments, opaque, whiten, and (2) at least one of heat-transfer, sticker, printing, painting the preferred design, art, cartoon, character, sport-team, clubs, school-team logo or arts of front surface. So, can show out the even brightness light performance or even brightness back-light to glow the built-in or added-on the arts, printing, heat-transfer, water transfer, film, painting, sticker, stencil on the said top or front surface to make at least one of (1) even brightness illumination or-and (2) cartoon, cartoon, characters, drawing, picture, printing, painting, art for more attractive and value lighted switch cover-plate light.

Because the said COB switch cover-plate light has similar front face so let people think it is real switch cover-plate. This is one other features of current invention.

The said COB switch cover-plate light power by battery with preferred glue, form tape, magnetic-piece, hooks and loops, Velcro tape, phone-openings to easily to install on any material surface for anywhere light for indoor or outdoor light or illumination with arts or message application.

BRIEF DRAWING

DETAIL DESCRIPTION

The Chips on board (hereafter as COB) is one new light source and become popular since 2018 after the cost drop to consumer acceptable. The COB has plurality of chip or dice or SMD surface mounted LED(s) to bond on the geometric shape printed circuit board and coated chemical to form one-unit. The chemical compound coating on plurality of LED(s) and chemical compound fill up all space between plurality of LED(s), so no any gaps and the chemical compound guide each LED light beam to all direction(s) so can form one geometric shaped area illumination. The geometric shapes including any pre-determined or preferred shape at least including strips, elongate, rectangular, curve shape, round, donut, circle, triangle or any other geometric shape.

From side view COB is a flat unit with preferred color of coating or PCB. The COB is different with market available other bonding LEDs which only bond on PCB without any chemical coating to increase the light spread-out for form a geometric shape such as strips, rectangular, donut, round, curve, or other geometric shape to see very close like area-illumination. The traditional Chip or dice or SMD LED unit directly bonding on PCB without coating on top, the light performance like multiple super strong spo-light(s) never can look like a shaped area illumination. Hence, COB light source has geometric shape area-light performance, so no need the front optics-lens such as opaque or whiten or texture to eliminate the super strong brightness spot-light effects. Hence, make a big improvement for mass production for less labor, less optics-lens on front. Furthermore, any Dip LED(s) which has conductive leg(s) is totally different with COB because all is individual unit and need soldering process to install on PCB without any coating process so is another super brightness spot-light(s) and each had limited angles, so can not form preferred geometric shape area-light illumination.

The COB switch cover-plate light for current invention, the front face is one of market available switch cover-plate construction select from (i) toggle switch, (ii) Rocket switch, (iii) round or tube twist switch, (iv) slide switch, (v) motion sensor switch, (vi) IR switch, (vii) RF switch, (viii) conductive switch, (ix) wireless connection switch, (x) wi-fi or wireless control switch, (xi) dimmer switch, (xii) timer switch, (xiii) touch switch.

Figure 1:
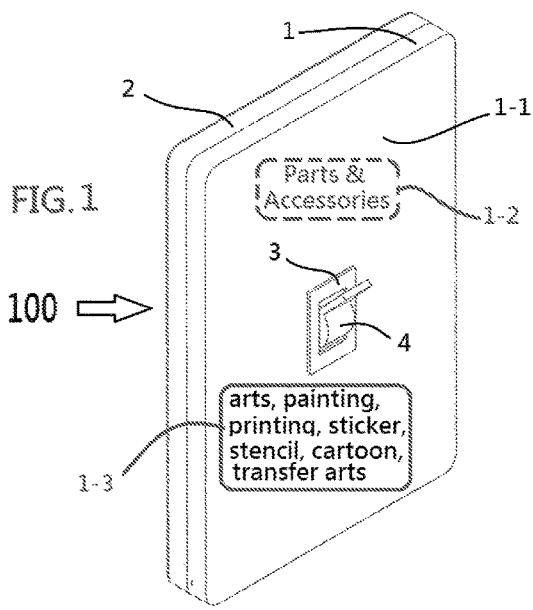
FIG. 1 show the one of preferred embodiment which has certain thickness with toggle switch on center.

From FIG. 1 show the COB switch cover-plate light 100) has the front (1) and back (2) housing to install the preferred combination parts and accessories (1-2) selected from (a) circuit (not show), (b) preferred switch's construction (not show), (c) COB light-unit(s), (d) battery, (e) IC, (f) Timer, (g) sensor, (h) wireless receiver, (i) wi-fi receiver circuit, (j) at least one of IR, or RF, or remote control, or wireless signal receiver, (k) at least one of one of photo, motion, moving, radar, heat, vibration, shaking sensor(s), (l) all kind of switch(s).

From FIG. 1 the switch is one of toggle switch while the people push switch to up (3) is turn on the light and while people switch to down (4) is off.

One of preferred application is adding one IC or timer circuit or system to make at least one function(s) or features select from;

(A) the COB turn on for a period time and turn off by itself to save the limited battery power. How long time can be selected while COB light has other select switch.

(B) the COB light has color changing, color selection, hi-low brightness, select functions between photo-sensor or motion sensor, (C) The COB light has chasing, random flashing, sequential, quickly flashing than human eye persistence responding-time so look like always-on, or other LED(s) light effect(s).

(D) The COB light incorporated with at least one of sensor(s), IC(s), circuit, conductive switch, IR or RF remote control system, all kind of mechanical switch or electric switch(s).

One of preferred application is adding at least one sensor to trigger the COB light circuit or system to make pre-determined light function(s).

From FIG. 1 show the front surface of COB light has preferred arts (1-3), painting (1-3), printing (1-3), sticker (1-3), stencil (1-3), cartoon character (1-3), heat-transfer film (1-3) on the front surface so can let inside even brightness back light to make all design(s), art(s), Photo(s), printing or painting piece(s), heat-transfer arts to glow at the dark place or under dark environment(s).

Figure 2:
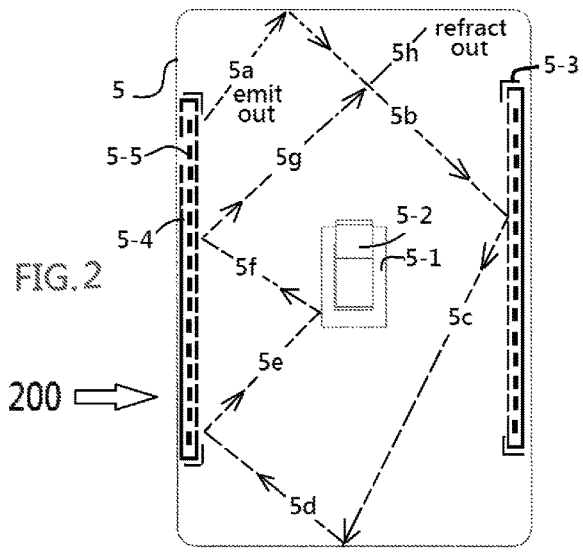
FIG. 2 show the Front view of $1^{st}$ preferred embodiment with toggle switch.

From FIG. 2 show the front surface (5) of COB light housing (200) has pre-determined size and dimension opening (5-1) or hole or cutout to install pre-determined mechanical switch (5-2) at least may select from (i) toggle switch, (ii) rocket switch, (ii) round twist switch, (iv) rotating switch, (v) slide switch, and (vi) other type mechanical switch. One of preferred embodiment, to change the said mechanical switch to electric switch such as (a) motion sensor, (b) conductive switch, (c) wi-fi system incorporate with download APP, (d) wireless signal receiver kits to receive at least one of IR, RF, Wi-Fi, Zigbee, Z-way signals to make setting, adjustment, control, change the audio or video or visual effects or function(s).

From FIG. 2, the COB light inner space has built-in area(s) (5-1) to install the preferred switch (5-2) and has holder (5-3) to hold or install the COB light-piece (5-4) which has built-in desire number(s) of chip, dice, SMD LED(s) (5-5) and coating for desired color and brightness and coating. The said COB light-piece (5-4) has terminal(s) to connect with at least one of circuit(s), IC(s), sensor(s), Switch to turn-on and turn-off with pre-determined color, brightness, function, sequential, fade-in and fade-out, steady glow, always on with or without timer setting to turn off automatically.

From FIG. 2, the inner space of the front surface (5) show one of the travel path of light beam.

The COB light-piece(s) (5-4) has desired number(s) LED (s) (5-5) emit the pre-determined brightness with desired viewing angle out from coated surface of COB light piece (5-4).

The light beam (5a) emit out from coated surface of COB light piece (5-4) and hit the inner wall of COB light and reflected to become light beam (5b).

The light beam (5b) emit to other COB light parts or inner walls of COB light device to be reflected (some light beam may also refract out from front lens of front housing).

The light beam (5c) travel to the inner wall or other COB light parts surface to be reflected (some light beam may also refract out from front lens of front housing) to become light beam (5d).

The light beam (5d) travel to the inner wall or other COB light parts surface to be reflected (some light beam may also refract out from front lens of front housing) to become light beam (5e).

The light beam (5e) travel to the inner wall or other COB light parts surface to be reflected (some light beam may also refract out from front lens of front housing) to become light beam (5f).

The light beam (5f) travel to the inner wall or other COB light parts surface to be reflected (some light beam may also refract out from front lens of front housing) to become light beam (5g).

The light beam (5g) travel to the inner wall or other COB light parts surface to be reflected (some light beam may also refract out from front lens of front housing) to become light beam (5h).

One of preferred embodiment, the light beam (5h) go through front housing and refract out to viewers.

The said light beam (5a) is one of example and emit from only one of LED(s) and emit to only one angle of LED(s). The COB light-piece (5-4) has number(s) of the LED(s) and each of LED(s) has preferred angles. So, under the front lens of front housing has at least millions light beam traveling and go through multiple times of reflection and refraction to get the at least one of (1) even brightness back light function or (2) even brightness illumination from current invention COB switch cover-plate light.

Figure 3:
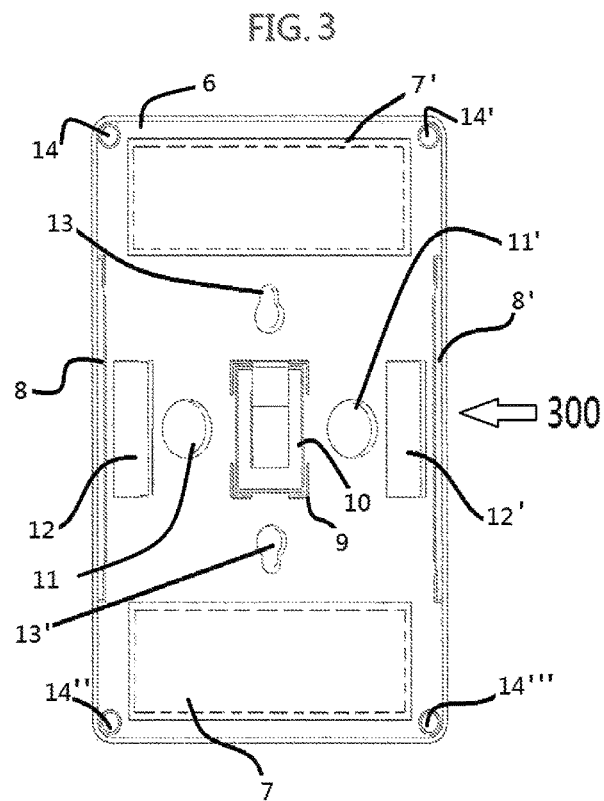
FIG. 3 show the back view of back housing has battery compartment with all kind market available fix-kits to allow people install anywhere without tool needed.

From FIG. 3 show the back side of back housing (300) which has at least one (i) The inner of back housing (300) has at least one of battery compartment (7) (7') to install preferred battery or batteries (not shown), (ii) The back housing (300) at least one location(s) (11) (11') to install at least one of magnetic-piece(s) (not shown) in geometric shape or construction with pre-determined magnetic force to allow people can easily attach the COB light on any metal surface, (iii) The back housing (300) has at least one of geometric shape pool (12) (12') to install the velcro-tap(s) or foam-tape to install the COB light on any surface by adhesive, chemical, compound, (iv) The back housing (300) has at least one of the openings (13), shape hole (13'), telephone hanging-hole(s) or geometric shape holes or opening(s) to allow hanging or install the said COB light on male piece passing through the said opening(s), hole(s).

(v) The inner side of the back housing (300) has the fix piece (9) for install at least one of the mechanical or electric switch (10), IC (not shown), circuit (not shown), sensor(s) (not shown), timer(s) (not shown), related electric parts and accessories (not shown) within.

(vi) The inner wall(s) of the back housing (300) has at least one of areas (8) (8') to install at least one of the COB light source(s) which has pre-determined number of dice, chip, SMD LED(s) installed and coating on whole COB light-piece with pre-determined brightness or wattage to emit light out from the said COB light source(s) in any geometric shape(s) at least having (a) rectangular, (b) elongate, (c) round, (d) donut, (f) curved, (g) triangle, or other (h) preferred shape with desire number of dice, chip, SMD LED(s) install within.

(vii) The back housing (300) has assembly kits to assemble the back housing (300) to front housing (200) by at least one of (i) screw holes for screw(s) (14), (ii) chemical compound to glue or melt together, (iii) sonic sealing, (iv) snap or push tight, (v) catcher and hook to catch together; and assembly kits make sure the assembled front and back housing pass all drop or pulling test and prevent people pick up the separated parts or accessories.

(viii) The back housing (300) also has the battery cover (Dot line) which has safety tabs fasten by screw or other tighten-kits to prevent battery drop out while drop off to floor or kids open battery cover.

Figure 4:
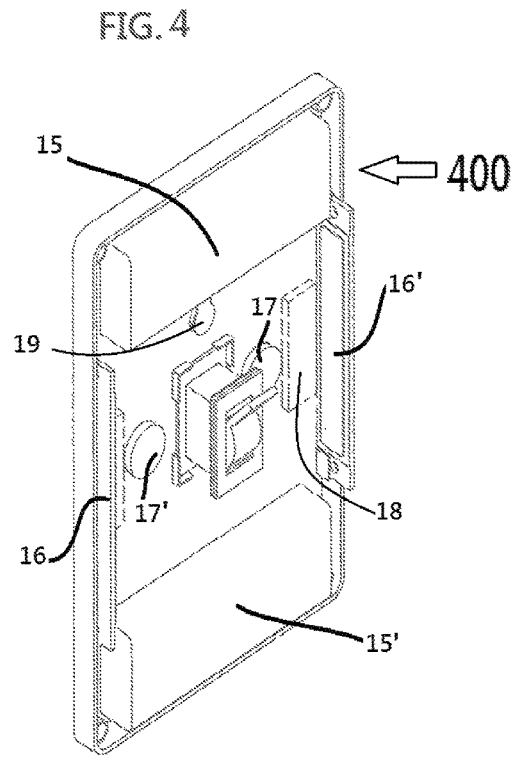
FIG. 4 show the side view of the back housing.

From FIG. 4 show one of preferred embodiment of back housing (400) inner construction. The inner space of back housing (400) has 2 COB light source piece(s) (16) (16') on two sides wall(s) to offer light brightness for elongate area(s). The said elongate area(s) illumination only can created by linear or elongate light source without incorporating with any other optics device(s). The elongate shape and construction COB light piece is one of the light source. The other donut or round or circle or triangle COB light piece is not possible to make elongate or strips or tubular areas illumination without incorporating with any other optics-lens or optics light guider such as fiber optics tube, solid plastic panel or tube. Hence, the current invention use elongate COB light source(s) as the light source and arrange all LED(s) light beam emit inward to make window(s) or area(s) of front housing can be lighted for even brightness or offer the even brightness back light for carried arts, display, design(s), cartoon character, film, sticker, stencil, grill as above discussed.

From FIG. 4, also has some raised area(s) including at least one of (i) battery compartment(s) (15), (ii) magnetic piece(s) (17), (iii) Velcro or foam tape magnetic piece(s) (18), so can form the Pool or recess area(s) on back side of back housing to allow install the battery, magnetic piece(s), foam tape, fasten and loops piece, Velcro, double side tape to allow people to install on any kind of surface. Furthermore the inner back housing (400) has some opening(s) for at least one of (1) screw to assemble with front housing (200), (2) sonic walls to allow applying the sonic sealing machine with front housing (200), (3) circles phone hook to allow people to hold the COB light on wall nail or screw body.

It is appreciated above discussed (1) parts and accessories, (2) functions, (3) features, (4) arrangement, (5) construction, (6) concept, (7) idea, (8) design for COB switch cover-plate light can be configured to create at least one
 (1) back light having even brightness,
 (2) even brightness illumination,
 (3) Color changing, color selection function(s) while had extra select-switch and IC,
 (4) function changing between photo sensor (Auto), Motion sensor (motion), moving sensor (Moving), Radar detector (all 360 degree sensor),
 (5) electric switch,
 (6) mechanical switch,
 (7) having wi-fi system with extender incorporate with download APP,
 (8) audio related device including download by Bluetooth, speaker, IC,
 (9) wireless connection including Z-way, ZigBee, IR, RF, and
 (10) incorporate 3/4/5/6 G internet device;
each of which should fall within the current invention scope and claims coverage.

From above current invention text and all co-pending or parent filed case test, drawing, construction related the COB light source should be fall within current invention scope, claims. The current invention for COB Light has even brightness illumination also has following (19) features.

1. COB switch cover-plate light has even brightness illumination, comprise;
 at least one of COB light piece(s) having number of chips, dice installed single circuit board with coating to offer at least one even brightness for
  (a) at least one front lens illumination, and
  (b) back light illumination for front lens having at least one arts, display, designs and cartoon or characters image(s);
 at least one of front lens having opening configure switch, and front lens assembly with back housing to emit out the preferred light performance.
 at least one DC storage device supply DC power for circuitry to operate COB light piece(s).

2. The COB switch cover-plate light has even brightness illumination as above discussed, the light has built-in at least one of battery compartment(s) to install, replace battery or batteries.

3. The COB switch cover-plate light has even brightness illumination as above discussed, the light has at least one of built-in elongate or rectangular or sheet or planar COB light source(s).

4. The COB switch cover-plate light has even brightness illumination as above discussed, the COB light source(s) install on inner wall(s) to emit to inner space of light and not emit to front lens of front housing.

5. The COB switch cover-plate light has even brightness illumination as above discussed, light has at once on of magnetic piece(s) to install on metal surface.

6. The COB switch cover-plate light has even brightness illumination as above discussed, light has at least one of foam tape, fasten and loosen tape, tape, 3M foam tape to install on surface(s).

7. The COB switch cover-plate light has even brightness illumination as above discussed, light has at least one of preferred shape opening(s), hole(s), cut-out(s) on back housing.

8. The COB switch cover-plate light has even brightness illumination as above discussed, the light incorporate at least one of circuit(s), IC(s), sensor(s), wireless system, wi-fi system, download APP, Z-way wireless system, ZigBee wireless system, Bluetooth wireless system, 3/4/5/6 G internet, IR or RF remote control system, and other wireless system.

9. The COB switch cover-plate light has even brightness illumination as above discussed, the COB switch cover-plate light has at least one of switch selected from mechanic switch(s), electric switch(s), conductive switch, rocket switch, twist switch, slide switch.

10. The COB switch cover-plate light has even brightness illumination as above discussed, the front lens has at least one whiten or opaque or texture treatment prevent people see inner parts and emit the preferred illumination out.

11. The COB switch cover-plate light has even brightness illumination as above discussed, the front lens has at least one of (1) arts, (2) display, (3) design(s), (4) cartoon character, (5) film, (6) sticker, (7) stencil, (8) grill, (9) heat-transfer film, (10) film, (12) slide; be illuminated by back light.

12. The COB switch cover-plate light has even brightness illumination as above discussed, the even brightness illumination is at least one of single color or more than one colors for (1) back light having even brightness, and (2) even brightness illumination, (3) color changing, color selection function.

13. The COB switch cover-plate light has even brightness illumination as above discussed, light has at least one of following function(s) select from (1) back light having even brightness, and (2) even brightness illumination, (3) color changing, color selection function(s) while had extra select-switch and IC, (4) function changing between photo sensor (Auto), Motion sensor (motion), moving sensor (Moving), Radar detector (all 360 degree sensor), (5) electric switch, (6) mechanical switch, (7) having wi-fi system with extender incorporate with download APP, (8) audio related device including download by Bluetooth, speaker, IC, (9) wireless connection including Z-way, ZigBee, IR, RF, (10) incorporate 3/4/5/6 G internet device (11) high-low brightness selection or changing basing on sensor(s), (12) quickly flashing more quickly than people eye persistence reactive so look like always on to increase battery life.

14. The COB switch cover-plate light has even brightness illumination as above discussed, the even brightness created by LED(s) light beam has multiple times reflection(s) and refraction(s) within the housing and emit out from front lens.

15. The COB switch cover-plate light has even brightness illumination as above discussed, the battery is a rechargeable battery and can be charged by USB wire, or DC adaptor male-plug, or outside DC power source such as power bank or external transformer, external DC storage unit(s) to storage solar, chemical created DC current.

16. The COB switch cover-plate light has even brightness illumination as above discussed, the COB light-piece has built-in desire number(s) of chip, dice, SMD LED(s) for desired color and brightness.

17. The COB switch cover-plate light has even illumination as above discussed, the even brightness illumination including at least one color or more than one colors illumination with desired light effects, selected from (1) color changing, (2) color selections while had $2^{nd}$ switch or use multiple push switch, (3) functions changing between all kind of function(s).

18. The COB switch cover-plate light has even brightness illumination as above discussed, assembly kits to assemble the back housing to front housing by at least one of
   (i) screw holes for screw(s),
   (ii) chemical compound to glue or melt together,
   (iii) sonic sealing,
   (iv) snap or push tight,
   (v) catcher and hook to catch together 19. The COB switch cover-plate Light has light has even illumination as above discussed, the battery compartment has battery cover which has safety tabs fasten by screw or other tighten-kits to prevent battery drop out while drop off to floor or kids open battery.

The invention claimed is:

1. A DC powered COB switch cover-plate light having even brightness illumination, comprising:
   at least one COB light piece having a plurality of chips or dice installed on a single circuit board with a coating to emit light beams of even brightness for illuminating or providing back light illumination of at least one front lens, the at least one front lens having at least one of art, a display, designs, and at least one cartoon or character image; and
   at least one DC storage device,
   wherein the at least one front lens has a switch opening and is assembled with a back housing to exhibit a preferred light performance, and
   wherein the at least one DC storage device supplies DC power for circuitry to operate the at least one COB light piece.

2. A DC powered COB switch cover-plate light having even brightness illumination as claimed in claim 1, wherein the light has at least one built-in battery compartment to install or replace at least one battery.

3. A DC powered COB switch cover-plate light having even brightness illumination as claimed in claim 1, wherein the at least one COB light piece is elongate, rectangular, a sheet, or a planar COB light source.

4. A DC powered COB switch cover-plate light having even brightness illumination as claimed in claim 1, wherein the at least one COB light piece is installed on at least one inner wall to emit to an inner space of the light and not to the front lens or a front housing.

5. A DC powered COB switch cover-plate light having even brightness illumination as claimed in claim 1, wherein the light has at least one magnetic piece to install the light on a metal surface.

6. A DC powered COB switch cover-plate light having even brightness illumination as claimed in claim 1, wherein the light has at least one of foam tape, a fasten and loosen tape, tape, and 3M foam tape to install the light on a surface.

7. A DC powered COB switch cover-plate light having even brightness illumination as claimed in claim 1, wherein the light has at least one shapes opening, hole, or cut-out on a back housing.

8. A DC powered COB switch cover-plate light having even brightness illumination as claimed in claim 1, wherein the light incorporates at least one of a circuit, integrated circuit, sensor, wireless system, Wi-Fi system, downloaded APP, Z-way wireless system, ZigBee wireless system, Bluetooth wireless system, 3/4/5/6 G internet, IR or RF remote control system, and other wireless system.

9. A DC powered COB switch cover-plate light having even brightness illumination as claimed in claim 1, wherein the COB switch cover-plate light has at least one of a mechanical switch, electrical switch, conductive switch, rocket switch, twist switch, and slide switch.

10. A DC powered COB switch cover-plate light having even brightness illumination as claimed in claim 1, wherein the front lens has at least one whitening, opaque, or textured treatment to prevent people from seeing inner parts.

11. A DC powered COB switch cover-plate light having even brightness illumination as claimed in claim 1, wherein the at least one front lens or housing has at least one of (1) art, (2) a display, (3) a design, (4) a cartoon character, (5) film, (6) a sticker, (7) a stencil, (8) a grill, (9) a heat-transfer film, and (10) a slide; be illuminated by back light.

12. A DC powered COB switch cover-plate light having even brightness illumination as claimed in claim 1, wherein the at least one COB light piece has one or more colors to provide at least one of (1) a back light for front art, a cartoon, or a display piece, (2) even brightness illumination to a viewer, and (3) color changing, color mixing, or color selection illumination.

13. A DC powered COB switch cover-plate light having even brightness illumination as claimed in claim 1, wherein the light has at least one of the following functions: (1) back lighting for front art, a cartoon, or a display piece, (2) even brightness illumination to a viewer, (3) at least one of a color changing, color mixing, and color selection function provided by an extra select-switch and integrated circuit, (4) function changing between a photo sensor, motion sensor, moving sensor, and 360 degree radar, (5) an electric switch incorporated with an integrated circuit to turn on and turn off, change, or select at least one function, (6) a mechanical switch to turn on and turn off, change, or select at least one function, (7) a Wi-Fi system with or without an extender incorporated with a downloaded APP, (8) an audio related device including Bluetooth, a speaker, and an integrated circuit, (9) a wireless connection selected from Z-way, ZigBee, IR, or RF, (10) 3/4/5/6 G communications, (11) high-low brightness selection or changing by at least one of a photo sensor, integrated circuit, switch, and motion sensor, (12) a flashing lighting effect that is quicker than a person's eye can perceive so that the illumination appears to be steady on while increasing battery life.

14. A DC powered COB switch cover-plate light having even brightness illumination as claimed in claim 1, wherein light beams emitted by the at least one COB light piece are reflected and/or refracted multiple times within the inner space of a light housing and emitted out from the front lens or front housing.

15. A DC powered COB switch cover-plate light having even brightness illumination as claimed in claim 1, wherein the battery is a rechargeable battery that can be charged by at least one of a USB wire, a DC adaptor male-plug, an outside DC power source such as power bank or external transformer, and at least one solar or chemical power source.

16. A DC powered COB switch cover-plate light having even brightness illumination as claimed in claim 1, wherein the COB light-piece has a number of built-in chips, dice, or SMD LEDs to provide a desired color and brightness.

17. A DC powered COB switch cover-plate light having even brightness illumination as claimed in claim 1, wherein the chips or dice include colors to provide light effects selected from (1) color changing, (2) color selection, and (3) illumination function changing.

18. A DC powered COB switch cover-plate light having even brightness illumination as claimed in claim 1, further including an assembly kit to assemble a back housing to a front housing by at least one of
   (i) screw holes and screws,
   (ii) a chemical compound to glue or melt the back and front housing together,
   (iii) sonic sealing,
   (iv) a snap fit or push tight connection, and
   (v) a hook and catch fastener.

19. A DC powered COB switch cover-plate light having even brightness illumination as claimed in claim 1, wherein the battery compartment has a battery cover which has safety tabs fastened by a screw or other fastener to prevent a battery from falling out or being removed by a child and swallowed.

\* \* \* \* \*